United States Patent
Mattausch et al.

(10) Patent No.: US 12,274,971 B2
(45) Date of Patent: Apr. 15, 2025

(54) APPARATUS AND METHOD FOR APPLYING ACCELERATED ELECTRONS TO GASEOUS MEDIA

(71) Applicant: Fraunhofer-Gesellschaft zur Förderung der angewandten Forschung e.V., Munich (DE)

(72) Inventors: Gösta Mattausch, Dresden (DE); André Weidauer, Dresden (DE); Ralf Blüthner, Dresden (DE); Jörg Kubusch, Dresden (DE); Frank-Holm Rögner, Dresden (DE); Volker Kirchhoff, Dresden (DE); Rainer Labitzke, Dresden (DE); Burkhard Zimmermann, Dresden (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 384 days.

(21) Appl. No.: 17/785,538

(22) PCT Filed: Dec. 14, 2020

(86) PCT No.: PCT/EP2020/085888
§ 371 (c)(1),
(2) Date: Jun. 15, 2022

(87) PCT Pub. No.: WO2021/122404
PCT Pub. Date: Jun. 24, 2021

(65) Prior Publication Data
US 2023/0010204 A1    Jan. 12, 2023

(30) Foreign Application Priority Data
Dec. 16, 2019 (DE) .................... 10 2019 134 558.8

(51) Int. Cl.
*B01D 53/00* (2006.01)
*B01D 53/34* (2006.01)
(Continued)

(52) U.S. Cl.
CPC ......... *B01D 53/007* (2013.01); *B01D 53/346* (2013.01); *B01D 53/8696* (2013.01); *B01J 35/56* (2024.01); *B01D 2259/812* (2013.01)

(58) Field of Classification Search
CPC ........................... B01D 53/346; B01D 53/007
See application file for complete search history.

(56) References Cited

U.S. PATENT DOCUMENTS 4,782,267 A    11/1988 Collins et al.

FOREIGN PATENT DOCUMENTS

DE    10 2006 012 666 A1    9/2007
DE    10 2013 111 650 B3    2/2015
(Continued)

OTHER PUBLICATIONS

International Search Report with English Translation, Mar. 10, 2021, pp. 1-4, issud in International Application No. PCT/EP2020/085888, European Patent Office, Rijswijk, The Netherlands.

*Primary Examiner* — Robert A Hopkins
(74) *Attorney, Agent, or Firm* — Crowell & Moring LLP

(57) ABSTRACT

Apparatuses and methods are provided for applying accelerated electrons to a gaseous medium by means of an electron beam generator, which has at least one cathode for emitting electrons and at least one electron exit window, wherein a) the at least one cathode is annular and the at least one electron exit window is in the form of an annular first hollow cylinder, the annular electron exit window in the form of the first hollow cylinder forms an inner wall of an annular housing of the electron beam generator, wherein the electrons emitted by the cathode are accelerated to the ring (Continued)

axis of the annular housing; b) an annular second hollow cylinder is arranged within the electron exit window in the form of the first hollow cylinder and delimits an annular space between the first hollow cylinder and the second hollow cylinder; c) a cooling gas is fed through the annular space between the first hollow cylinder and the second hollow cylinder; and d) the gaseous medium to which accelerated electrons are to be applied is fed through the second hollow cylinder.

20 Claims, 7 Drawing Sheets

(51) Int. Cl.
 *B01D 53/86* (2006.01)
 *B01J 35/56* (2024.01)

(56) References Cited

FOREIGN PATENT DOCUMENTS

| | | | |
|---|---|---|---|
| DE | 10 2013 113 688 B3 | | 5/2015 |
| DE | 10 2017 104 509 A1 | | 9/2018 |
| JP | 2003 279698 A | | 10/2003 |
| JP | 2011218293 A | * | 11/2011 |

* cited by examiner

APPARATUS AND METHOD FOR APPLYING ACCELERATED ELECTRONS TO GASEOUS MEDIA

CROSS-REFERENCE TO RELATED APPLICATIONS

This application is a 371 nationalization of international patent application PCT/EP2020/085888 filed Dec. 14, 2020, which claims priority under 35 USC § 119 to German patent application DE 10 2019 134 558.8 filed Dec. 16, 2019. The entire contents of each of the above-identified applications are hereby incorporated by reference.

DETAILED DESCRIPTION

Figure 1:
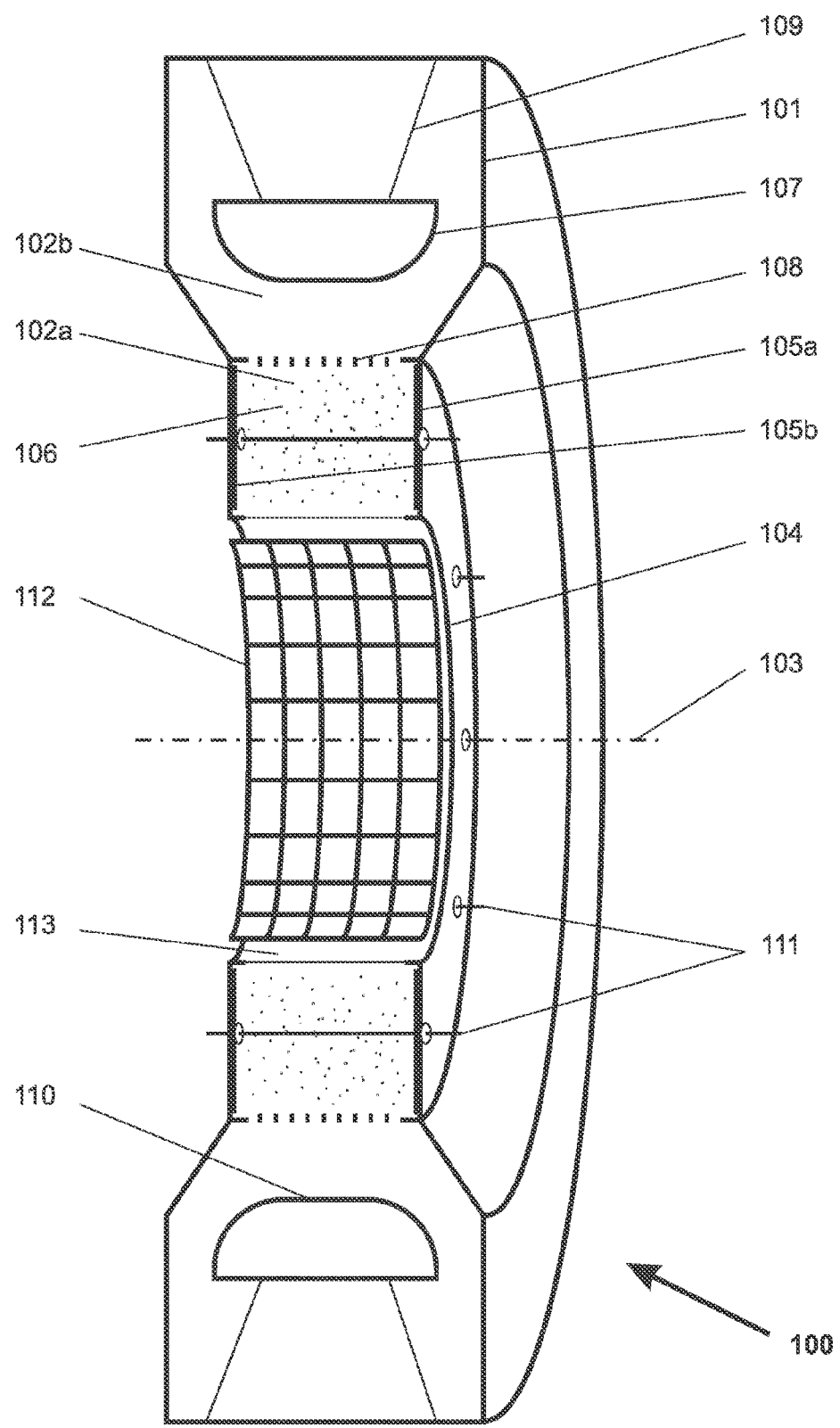
FIG. 1 is a schematic and perspective sectional view of an apparatus according to the invention.

The invention relates to an apparatus and a method for applying accelerated electrons to gaseous media, as a result of which a chemical conversion of the gaseous medium or a gas synthesis is brought about. A gaseous medium in the sense of the invention is to be understood as meaning gases, gas mixtures, vapors, and aerosols, all of which can also contain solid particles, as is the case, for example, with exhaust gases from internal combustion engines, industrial plants, or thermal power plants.

Electron beam technology has been used on an industrial scale for several decades to chemically modify materials and to disinfect or sterilize surfaces. Products can be treated economically at atmospheric pressure, for which purpose the electrons must first be released in a vacuum, then accelerated, and finally decoupled into the treatment zone through a beam exit window, usually a thin metal foil. Accelerating voltages of >100 kV are typically required to penetrate sufficiently robust electron exit windows that can be used on an industrial scale and also to ensure a sufficient treatment depth in the product.

Various processes and beam sources are well established for treating the surface layer of flat products such as plates and strips, while the all-round treatment of shaped bodies, bulk goods, and fluids continues to cause problems. Thus, an all-round uniform application of electrons to curved surfaces is geometrically problematic due to shadowing effects and locally different projection conditions. The energy transfer that varies locally along the path when electrons propagate in an absorbing medium represents a further source of dose inhomogeneity, which also affects the treatment of fluids—gaseous and liquid media.

With the already existing source systems, such as axial radiators with a fast deflection unit or ribbon radiators with an elongated cathode, both of which are operated with a heated thermionic cathode, an all-round product treatment of shaped bodies or the application of uniform energy doses in flowing fluids is merely cumbersome and possible only with use of additional equipment or with a high expenditure on equipment and/or technology. Electron beam sources based on thermionic emitters are also mechanically complex, difficult to scale, and require expensive high-voltage power supplies and high-vacuum systems. If the beam exit window is damaged and the vacuum collapses as a result, the cathode system will be irreversibly damaged and the cost of repairs will be high.

DE 199 42 142 A1 discloses an apparatus in which bulk material is guided past an electron beam apparatus in multiple free falls and accelerated electrons are applied thereto. Due to the multiple passes, combined with an interim mixing of the bulk material, the probability in this embodiment is very high that accelerated electrons will be applied to the particles of the bulk material on all sides. If a fluid were fed through the treatment zone instead of the bulk material, the integrally transmitted energy dose could also be equalized by the multiple passes. However, the multiple passes require a lot of time when carrying out the treatment process.

Another solution is specified in DE 10 2006 012 666 A1, which includes three axial radiators with associated deflection control and three associated electron exit windows. The three electron exit windows are arranged in such a way that they completely enclose a triangular free space. If a substrate is guided through this free space, it is possible to apply accelerated electrons over its entire cross-section in one treatment pass. However, the outlay on equipment is very high in this embodiment, which means that this solution is also very expensive. Nevertheless, the dose distribution of applying accelerated electrons to the surface of the substrate will turn out to be inhomogeneous as soon as the substrate does not have a triangular cross section congruent to the free space enclosed by the three electron exit windows. A uniform dose transfer into the volume of fluids is impossible due to the widely differing distances to the electron exit windows over the cross section of the treatment zone in a single pass.

To solve this problem, WO 01/97954 A2 proposed arranging a plurality of planar electron beam generators along one side and symmetrically opposite one another on the other side of a rectangular treatment chamber. This superposition improves the dose homogeneity in the volume, but again at the cost of high equipment outlay. In addition, fluids are usually conducted in pipes with a circular cross-section. The transition to the rectangular cross-section of the treatment chamber is associated with the formation of vortices, which increase the flow resistance as well as causing dose homogeneity due to locally varying flow speeds or stationary vortex structures.

An annular apparatus for generating accelerated electrons is disclosed in DE 10 2013 111 650 B3, in which all the essential components, such as the cathode, anode, and electron exit window, are annular so that such an apparatus can be used to form an annular electron beam in which the accelerated electrons move toward the inside of the ring. By means of such an apparatus, for example, it is possible to apply accelerated electrons to strand-shaped substrates that are moved through the ring opening of the apparatus over the entire circumference with respect to the substrate cross section. An apparatus known from DE 10 2013 111 650 B3 usually has a circular ring shape, but can also be designed to have any other ring shape. By means of such an annular apparatus, it is possible to apply accelerated electrons not only to rod-shaped substrates, but also, for example, to bulk material that is guided through the ring opening in free fall or gases that flow through the ring opening. However, such an apparatus is not suitable for treating hot gases, such as exhaust gases from internal combustion engines or chemical synthesis gases, because the electron exit window, which comes into contact with the hot gas when a hot gas flows through the ring opening, cannot withstand the thermal or corrosive stress.

Finally, from J. M. Connelly et al., "Application of radio-frequency electron gun to waste treatment," Radiation Physics and Chemistry, 2019, Ref.: 108440, a star-shaped electron beam source is known in which several high-energy axial emitters are arranged uniformly around a liquid or gaseous medium to be treated in such a way that the beam directions of all axial emitters intersect at one point. Gases can also be treated by means of such an apparatus, with the temperature of the gases having an upper limit because the electron exit windows of the axial radiators are directly exposed to the gases to be treated. Furthermore, such an apparatus requires the periphery for controlling and operating at least five electron emitters and thus a high level of technical complexity. This is further increased by the need to work with high electron energy in order to penetrate and uniformly apply to large cross sections, which in particular also increases the expense for shielding from the X-ray radiation generated as an unavoidable disruptive effect.

Problem Definition

The invention is therefore based on the technical problem of creating an apparatus and a method for applying to and chemically converting gaseous media with the aid of accelerated electrons, by means of which the disadvantages of prior art can be overcome. In particular, it should be possible with the apparatus according to the invention and with the method according to the invention to apply accelerated electrons to and chemically convert hot gaseous media, such as exhaust gases from internal combustion engines or chemical synthesis gases, with little technical effort.

An apparatus according to the invention can initially have all the features of an annular electron beam source, as are known from DE 10 2013 11 650 B3 and DE 10 2013 113 668 B3. Thus, an apparatus according to the invention for applying accelerated electrons to gases, gas mixtures, vapors, and aerosols (which are possibly loaded with solid particles and summarized under the term "gaseous media") comprises at least one electron beam generator, which has at least one cathode for emitting electrons and at least one electron exit window, wherein the at least one cathode is annular and the at least one electron exit window is designed as an annular first hollow cylinder. The annular electron exit window designed as the first hollow cylinder forms an inner wall of an annular housing of the electron beam generator, wherein the electrons emitted by the cathode can be accelerated towards the ring axis of the annular housing. According to the invention, an annular second hollow cylinder is arranged within the electron exit window formed as a first hollow cylinder, which delimits an annular space between the first hollow cylinder and the second hollow cylinder. In an apparatus according to the invention, a cooling gas flows through the annular space between the first hollow cylinder and the second hollow cylinder, and the gaseous medium to which accelerated electrons are to be applied flows through the second hollow cylinder. As a result of the cooling gas flowing through the annular space between the first hollow cylinder and the second hollow cylinder, overheating and contamination of the electron exit window with condensates and solid particles and its destruction resulting therefrom can be avoided, and therefore particle-loaded hot gaseous media can also be treated with an apparatus according to the invention.

At this point it should be expressly pointed out that the term "annular" in the sense of the invention is not limited to just a circular ring for all annular apparatuses and components described below. The cross-section of annular elements of an apparatus according to the invention is circular in a preferred embodiment of the invention, but can also have any other geometric shape in the broadest sense of the invention.

In the method according to the invention for applying accelerated electrons to a gaseous medium and the resulting chemical conversion of the gaseous medium, an electron beam generator is used, which has at least one cathode for emitting electrons and at least one electron exit window. The at least one cathode (107) is annular and the at least one electron exit window is formed as an annular first hollow cylinder, wherein the annular electron exit window formed as a first hollow cylinder forms an inner wall of an annular housing of the electron beam generator and wherein the electrons emitted by the cathode pointing to the ring axis of the annular housing are accelerated. Furthermore, an annular second hollow cylinder is arranged within the electron exit window formed as a first hollow cylinder, which delimits an annular space between the first hollow cylinder and the second hollow cylinder. Furthermore, a cooling gas is fed through the annular space between the first hollow cylinder and the second hollow cylinder and the gas or gas mixture to which accelerated electrons are to be applied is fed through the second hollow cylinder.

Example Embodiment

The invention is explained in more detail below on the basis of an example embodiment.

At this point, for a better understanding of the invention, the terms "annular cylinder" and "annular disk" are defined in relation to an annular object. Subtracting the inner radius of a circular ring from its outer radius gives a dimension. If this dimension is smaller than the extent of the ring in the direction of its ring axis, then the ring is an annular cylinder. If, however, this dimension is greater than the extent of the ring in the direction of its ring axis, the ring is an annular disk.

Figure 2:
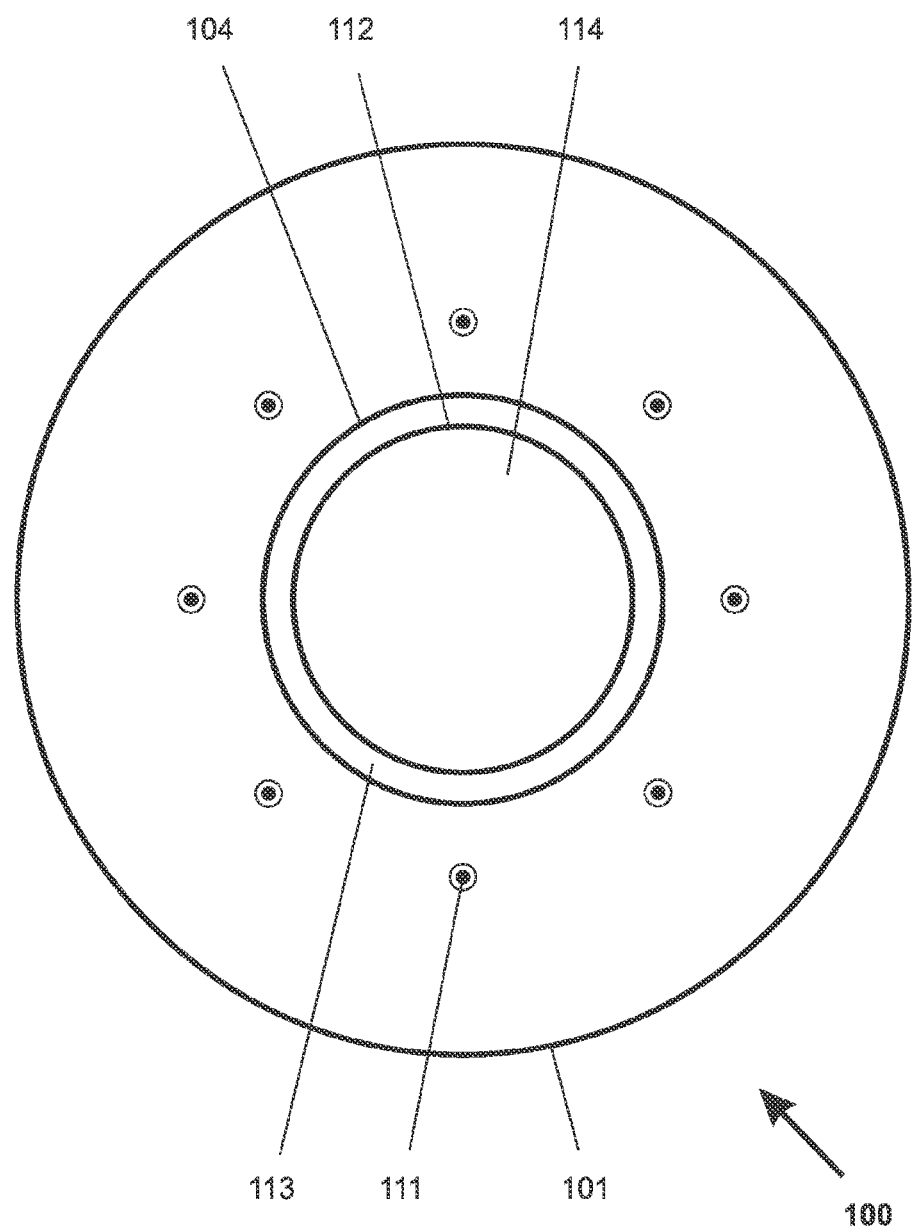
FIG. 2 is a schematic representation of a plan view of the annular elements of the apparatus according to the invention from FIG. 1.

One and the same apparatus 100 according to the invention is shown schematically in FIGS. 1 and 2, where FIG. 1 is a perspective sectional view and FIG. 2 is a plan view of the annular elements. An apparatus according to the invention initially comprises an annular housing 101, which delimits an evacuatable space 102, at least in one area, which is divided into the evacuatable spaces 102a and 102b. This evacuatable space 102 is also annular due to the shape of the housing. In the exemplary embodiment from FIGS. 1 and 2, the housing 101 is designed as a radially symmetrical ring which has a ring axis 103. All of the components described below, which are associated with the apparatus 100 and are referred to as annular are also designed as radially symmetrical rings and have one and the same ring axis 103. On the inside of the ring of the housing 101, the housing 101 is formed as an electron exit window 104 in the form of a first hollow cylinder, i.e., viewed in the exit direction of the electrons, the electron exit window 104 has a surface perpendicular to the ring interior, and, in the case of a circular hollow cylinder as in the case of the electron exit window 104, is aligned with the ring axis 103. A working gas is admitted into the evacuatable space 102 through at least one inlet in the housing 101 (not shown in FIG. 1) and a vacuum is maintained in a range of 0.1 Pa to 20 Pa and preferably in a range of 1 Pa to 3 pa in the evacuatable space 102 by at least one pump means (not shown in FIG. 1 either).

An apparatus according to the invention also has at least one first cathode and at least one first anode, between which a glow discharge plasma can be generated in the evacuatable space 102*a* by means of a first electrical voltage that can be applied and is provided by a first power supply apparatus. In the embodiment, two wall regions of the housing 101 shaped as annular disk segments were formed as the first cathodes 105*a* and 105*b*, which delimit the space 102*a* on the opposite side. In the case of the apparatus 100, the housing 101 and the first cathodes 105*a*, 105*b* therefore have the same electrical potential, which is simultaneously the electrical ground potential of the apparatus 100.

The first anode of an apparatus according to the invention comprises a number of wire-like electrodes which extend through the space 102*a* and, in the case of a housing in the form of an annular ring, such as the housing 101, are preferably arranged on an identical radius and equidistant from one another around the axis 103. The wire-like electrodes 111, which can have a slightly positive voltage potential in a range from +0.25 kV to +5.0 kV compared to the housing 101, are fed through the housing 101 and the first cathodes 105*a*, 105*b* in an electrically insulated manner. Due to the electrical voltage applied between the wire-shaped electrodes 111 and the first cathodes 105*a* and 105*b*, a plasma is formed in the space 102*a*. The space 102*a* is therefore also referred to below as the plasma space 102*a*.

An apparatus according to the invention also comprises at least one second cathode and at least one second anode, between which a second electrical voltage is connected by means of a second power supply apparatus. In apparatus 100, a cathode 107 is designed as the second cathode and a grid-shaped anode 108 is designed as the second anode. Both cathode 107 and anode 108 are annular.

In an apparatus according to the invention, the second cathode represents the cathode for emitting secondary electrons, which are then accelerated, and for this purpose has an electrical high-voltage potential, preferably in the range of from −80 kV to −300 kV. The second cathode 107 is electrically insulated from the housing 101 by means of an insulator 109.

In the embodiment of the invention described in FIG. 1, the second anode 108 and the first cathodes 105*a*, 105*b* have the same electrical potential, which is in the form of an electrical ground potential. Alternatively, the second anode and the first cathode can also have different electrical potentials.

Ions are accelerated from the plasma 106 in the space 102*a* through the grid-shaped second anode 108 in the direction of the second cathode 107 by applying a high-voltage potential in the range of from −80 kV to −300 kV. There the ions impinge on a surface area 110 of the second cathode 107, whose surface perpendicular to the ring interior of the housing is aligned with the ring axis 103. When the ions impinge on the surface area 110, the ions have fallen through a potential difference which largely corresponds to the acceleration voltage of the apparatus 100. Upon their impingement, the energy of the ions is released in a very thin surface layer of the cathode 107 in the surface area 110, which leads to the release of secondary electrons. With the aforementioned electrical voltages at the second cathode 107, the ratio between released electrons and impinging ions is in the order of 10, which makes this type of generating accelerated electrons very efficient. The resulting secondary electrons are greatly accelerated by the applied electrical field and fly through the grid-shaped anode 108, which is formed in the form of an annular cylinder, and the plasma 106 in the space 102*a*. After passing through the electron exit window 104, which can be formed as a thin metal foil, for example, the electrons penetrate into the free space enclosed by the annular housing 101, in which a higher pressure than in space 102 can prevail. All materials known from prior art for an electron exit window, such as titanium, can be used as the material for the electron exit window 104. In addition, for the purpose of greater mechanical stability of the electron exit window 104, it is advantageous to provide it with a supporting grid, as is also known from prior art.

Due to the annular shape of the aforementioned components of an apparatus according to the invention, a curtain of accelerated electrons is generated in the form of a ring, wherein the direction of movement of the accelerated electrons is aligned with the free space enclosed by the housing ring. In a radially symmetric apparatus according to the invention, such as the apparatus 100, the direction of movement of the accelerated electrons is preferably aligned with the axis 103 of the ring.

For the sake of completeness, it should be mentioned at this point that an apparatus according to the invention also has an apparatus for cooling the apparatus, as is also known from prior art in apparatuses for generating accelerated electrons. For example, this apparatus for cooling an apparatus according to the invention can comprise cooling channels which extend inside the insulator 109 and through which a cooling medium flows.

The second anode 108, which is preferably designed as a grid-shaped annular cylinder in an apparatus according to the invention and which represents the spatial boundary between the evacuatable spaces 102*a* and 102*b*, fulfills three essential tasks. Firstly, due to its voltage difference compared to the second cathode 107, it causes the ions extracted from the plasma to be accelerated in the direction of the second cathode. Secondly, it also causes the secondary electrons generated by the ion bombardment to be accelerated in the direction of the electron exit window 104. Due to the fact that the grid structure of the second anode 108 is formed parallel to the secondary electron-emitting surface 110 of the second cathode 107, an electric field is formed such that the paths of the accelerated secondary electrons also run largely parallel. Furthermore, the second anode 108 shields the plasma from the voltage potential of the second cathode 107, thereby preventing too many ions from drifting in the direction of the second cathode 107 and thus contributing to maintaining the plasma 106 in the space 102*a*.

According to the invention, a second hollow cylinder 112 is arranged inside the electron exit window 104 formed as the first hollow cylinder, wherein the second hollow cylinder 112 has a smaller diameter than the annular electron exit window 104 so that the second hollow cylinder 112 delimits an annular space 113 between the second hollow cylinder 112 and the electron exit window 104 formed as the first hollow cylinder.

The second hollow cylinder 112 delimits a free space 114 inside the hollow cylinder 112. A gaseous medium, to which accelerated electrons are to be applied, flows through the free space 114 enclosed by the second hollow cylinder 112, which medium may also have solid particles, as is the case, for example, with exhaust gases from internal combustion engines.

The electron exit window of an electron beam generator receives an input of heat simply from the bombardment with charged particles inside the electron beam generator. If a hot gas, which flows through the free space 114 delimited by the second hollow cylinder 112, is then also treated with a previously described electron beam generator 100, the electron exit window 104 experiences an additional thermal load, which can lead to damage to the electron exit window 104. According to the invention, therefore, a cooling gas flows through the annular space 113, which dissipates thermal energy and thus protects the electron exit window 104 from thermally induced damage.

In one embodiment, the cylinder wall of the second hollow cylinder 112 has a large number of openings. The accelerated electrons can enter the treatment space in front of the electron exit window 104 unhindered through the openings. For example, the cylinder wall of the second hollow cylinder 112 can have a grid structure or consist of a gauze. The grid structure or gauze of the second hollow cylinder 112 can consist of a temperature-resistant material with a melting point greater than 1,250° C., for example. Hot gaseous media can also be treated by means of an apparatus according to the invention designed in this way.

Such a temperature-resistant material can consist, for example, of at least one metal or a metal compound such as, for example, yttrium-stabilized zirconium oxide or of a stainless steel or a refractory metal. The second hollow cylinder can consist of one material throughout or alternatively comprise a base body made of, for example, a metal or a metal compound, on the inner wall of which at least one layer of a temperature-resistant material with a melting point greater than 1,250° C. has been deposited.

With such a second hollow cylinder, it is also possible to apply accelerated electrons to and chemically convert gaseous media with a high temperature, such as exhaust gases from internal combustion engines or chemical synthesis gases.

If the cylinder wall of the second hollow cylinder 112 has a large number of openings, it is advantageous if the gaseous medium to be treated flowing through the free space 114 within the second hollow cylinder 112 and the gas flowing through the annular space 113 each have the same direction of flow. If the two gas streams flow in opposite directions, this could lead to greater turbulence in the two gas streams at the openings in the cylinder wall of the second hollow cylinder 112, which can result in heat build-up due to poorer gas flow. It is also advantageous if the same pressure conditions are set inside the annular space 113 as inside the second hollow cylinder 112 so that there is no mixing of the two gas flows at the openings in the cylinder wall of the second hollow cylinder 112 or particles entering the annular space 113.

An apparatus according to the invention can therefore have a first control circuit, with which the pressure within the annular space 113 can be adjusted. Such a first control circuit can, for example, have a first sensor for detecting a first actual value for the pressure inside the hollow cylinder 112, a second sensor for detecting a second actual value for the pressure inside the annular space 113, and include an evaluation apparatus and a fan or a pump apparatus for generating of the cooling gas flow through the annular space 113. In this case, the first actual value is compared with the second actual value by means of the evaluation apparatus and, for example, the electrical output of the fan or the pump apparatus for generating the cooling gas flow is set depending on the result of the comparison. If the evaluation apparatus determines that the pressure in the annular space 113 is too low, the electrical output of the fan or the pump apparatus can be increased, for example, until the pressure in the annular space 113 is exactly the same as the pressure inside the second hollow cylinder 112. Conversely, the electrical output of the fan or the pump apparatus can be reduced if the evaluation apparatus determines a higher pressure in the annular space 113 than in the interior of the second hollow cylinder 112.

Alternatively, the pressure within the second hollow cylinder 112 can also be adapted to the pressure in the annular space 113 by means of such a first control loop if the control loop comprises means for adjusting the pressure within the second hollow cylinder 112, such as a fan or a pump apparatus, by means of which the gas flow of the gas or gas mixture to be treated is generated by the second hollow cylinder, and this fan or this pump apparatus is controlled as a function of the determined values for the pressure in the annular space 113 and inside the second hollow cylinder.

It was previously described that the pressures in the annular space 113 and inside the second hollow cylinder 112 are set identically by means of the first control loop. However, by means of such a first control circuit, it is also possible to set the pressure within the annular space 113 slightly higher than the pressure prevailing within the second hollow cylinder 112 so that the cooling gas passes in small quantities into the free space 114 within the second hollow cylinder 112. With such a procedure, it is avoided in any case that the possibly hot and particle-laden gaseous medium flowing through the second hollow cylinder enters the annular space 113 and thereby additionally thermally loads or contaminates the electron exit window 104.

Protection of the electron exit window 104 of an apparatus according to the invention against overheating and a reliable operation of an apparatus according to the invention, but above all the setting of a local power density distribution adapted to hydrodynamic and thermodynamic parameters of the gaseous medium, i.e. the power density distribution at a given location per unit of time and volume of the amount of energy transferred to the gas particles by electrons, can additionally or alternatively be ensured by means of a second control loop. For this purpose, the acceleration voltage applied between the second cathode 107 and the second anode 108 is adjusted as a function of the composition and temperature of the gaseous medium flowing through the second hollow cylinder 112 and the pressure and flow profile prevailing therein. In this case, use is made of the fact that the electron scope within the relevant energy range (<1 MeV) is approximately quadratically dependent on the acceleration voltage and inversely proportional to the mass density of the energy-absorbing medium. The composition, specifically the correlating mean mass of the gas particles, the pressure, and the temperature of the gaseous medium flowing in the second hollow cylinder 112 determine its effective mass density. The higher the average particle mass and the pressure and the lower the temperature of the gaseous medium, the higher its mass density and the higher the required acceleration voltage. The flow profile, i.e., the radial velocity distribution of the gas particles, is also relevant for determining a beneficial acceleration voltage. This is minimal on the inner wall of the second hollow cylinder 112 and maximal in the center of the free space 114. In order to ensure that the energy dose is transferred to the gas particles as uniformly as possible, the acceleration voltage must be set so high that the resulting electron scope and electron scattering lead to a maximum power density distribution in the center of free space 114 that decreases radially outwards. An upper limit for the acceleration voltage is set by the fact that the electron scope must not be selected to be greater than the diameter of the second hollow cylinder 112 in order to avoid thermal loading of the diametrically opposite areas of the electron exit window 104. If the power density profile set up for a working point (characterized by the prevailing gas composition or mean particle mass m, pressure p, temperature T, and gas throughput D) is to be maintained in the further course of the process by selecting a beneficial acceleration voltage, the acceleration voltage must be dependent on the changed state variables of the gaseous medium must be readjusted. In one embodiment of this second control circuit, actual values for the gas composition, the pressure, the temperature, and the flow rate in the free space 114 are therefore continuously, but in each case at uniform times, recorded by means of corresponding sensors and processed in an evaluation apparatus. Higher gas flow rates generally cause an increase in the ratio between the minimum and maximum flow velocity, which tends to be compensated for by increasing the acceleration voltage. The average particle mass m can be determined from the gas composition, which is then multiplied by the quotient of the actual pressure p and the actual temperature T. If this product falls over time, the acceleration voltage $U_B$ is also reduced according to a predefined functional relationship $U_B=U_B$ (m, p, T, D), and, conversely, the acceleration voltage is increased according to the same functional relationship if the product increases over time. Simplified embodiments of this second control loop result when one or more of the state variables (m, p, T, D) can be assumed to be time-independent. If, for example, it is known that the gas composition, temperature, and flow rate do not change in a specific technological process, the functional relationship for controlling the acceleration voltage is reduced to $U_B=U_B$ (p), wherein the acceleration voltage must then be increased or decreased approximately proportionally to the pressure.

The stable operation of an apparatus according to the invention, above all ensuring the technologically specified energy dose E to be transferred to the gaseous medium with the smallest possible fluctuation range, can also be implemented by means of a third control loop, through which the beam current $l_B$ to be emitted by the second cathode 107 of an apparatus according to the invention is regulated as a function of the composition, pressure, temperature, and flow rate of the gaseous medium within the second hollow cylinder 112. As shown in the description of the second control circuit, the effective mass density of the gaseous medium and the beneficial acceleration voltage $U_B$ for the initial operating point can be determined from the gas composition, pressure, temperature, and flow rate. The product of the effective mass density and the mean flow rate within the second hollow cylinder 112 quantifies the integral mass flow F of the gaseous medium. To achieve a desired physical activation and subsequent chemical conversion of the gaseous medium, a certain energy dose E is required, which is commonly specified as a technology parameter. From this, the power to be converted in the gaseous medium and to be introduced into the free space 114 by the accelerated electrons can be calculated according to $P_G=E \cdot F$. With the acceleration voltage $U_B$ set by the second control circuit, this is achieved with an electron current of $l_G=P_G/U_B$ radiated into the gaseous medium. For this purpose, the beam current $l_B$ to be emitted by the second cathode 107 must be increased by the number of the electron losses to be added on the path from the surface of the second cathode 107 to the inner wall of the second hollow cylinder 112, which can be subsumed as leakage current $l_B=l_G+l_v$. These losses occur as a result of elastic and inelastic scattering of the accelerated electrons as they pass through the evacuatable spaces 102a and 102b, the plasma 106, the second anode 108, the electron exit window 104, the annular free space 113, and the second hollow cylinder 112. The functional dependency of the leakage current $l_v$ on the various apparatus and process parameters can in principle be grasped analytically in a sufficiently precise manner or, alternatively, by calibration measurements.

If a constant energy dose E is to be applied to the gaseous medium within the second hollow cylinder 112 regardless of the gas throughput, a beneficial acceleration voltage must first be determined and continuously tracked according to the criteria and algorithms described for the second control circuit, then the beam current can also be regulated also as a function of the gas composition, pressure, temperature, and flow rate within the second hollow cylinder 112. In one embodiment of this third control circuit, actual values for the gas composition, the pressure, the temperature, and the flow rate within the second hollow cylinder 112 are recorded continuously, but in each case at uniform times, by means of correspondingly assigned sensors and processed within an evaluation apparatus, specifically the instantaneous mass flow of the gaseous medium calculated according to the relationships set out above. If this increases over time, the beam power $P_G$ of the apparatus according to the invention introduced into the gaseous medium is also increased proportionally and vice versa since the beam current $l_B$ is set with regard to the instantaneous acceleration voltage $U_B$ set by the second control loop and the (calculated or tabulated) leakage current $l_v$. Simplified embodiments of this third control circuit are obtained by using the sensors of the second control circuit and the measured values they provide to calculate the manipulated variables of the third control circuit, and by keeping one or more process parameters constant, analogous to the explanations for the design of the second control circuit.

Depending on the application, it can alternatively be expedient not to keep the absorbed dose transferred to the gaseous medium constant, but to regulate it as a function of a composition of the gaseous medium to be treated that is desired as a result of the chemical conversion.

This is relevant, for example, for cleaning engine exhaust gases of $SO_X$, $NO_X$, and partially combusted hydrocarbons. The pollutant content in the exhaust gas does not vary strictly in proportion to the gas flow, but according to its own characteristics, individual to the respective pollutant species and as a function of the current engine load. In addition, a changing ratio of the mentioned pollutants to each other also causes a change in the absorbed dose required to neutralize them. The aim of exhaust gas cleaning, which is known to be achieved by electron treatment, is to fall below non-critical limit values for all pollutants after processing. A certain absorbed dose is required for this. If this is exceeded, the energy consumption of the electron source is further increased, but no significant increase in the cleaning effect is achieved. This means that energy efficiency suffers under these conditions.

In order to avoid this, the third control circuit can be designed in such a way that sensors for the gas composition are arranged after energy transfer zone in front of the electron exit window 104 has been passed through and/or, if the gaseous medium converted after the electron treatment passes through further chemical or physical treatment apparatuses, after all of the apparatuses combined in the relevant process module have passed and the beam current is regulated such that a predetermined composition of the gaseous medium is achieved. In one embodiment, therefore, at least one sensor for detecting actual values for the composition of the gaseous medium is arranged within a zone of the gas flow of the gaseous medium, in which zone the gas flow has passed the electron exit window 104 and the beam current is controlled as a function of the actual values of this sensor.

This configuration of the third control loop is of great importance not only for the treatment of exhaust gas, but also in particular for chemical synthesis processes of gaseous media to be treated with accelerated electrons.

In an apparatus according to the invention, the acceleration voltage of the electron beam generator and/or the beam current of the electron beam generator can thus be regulated as a function of the gas composition and/or the pressure and/or the temperature and/or the flow profile within the second hollow cylinder 112 and/or after passing downstream processing apparatuses.

Figure 3:
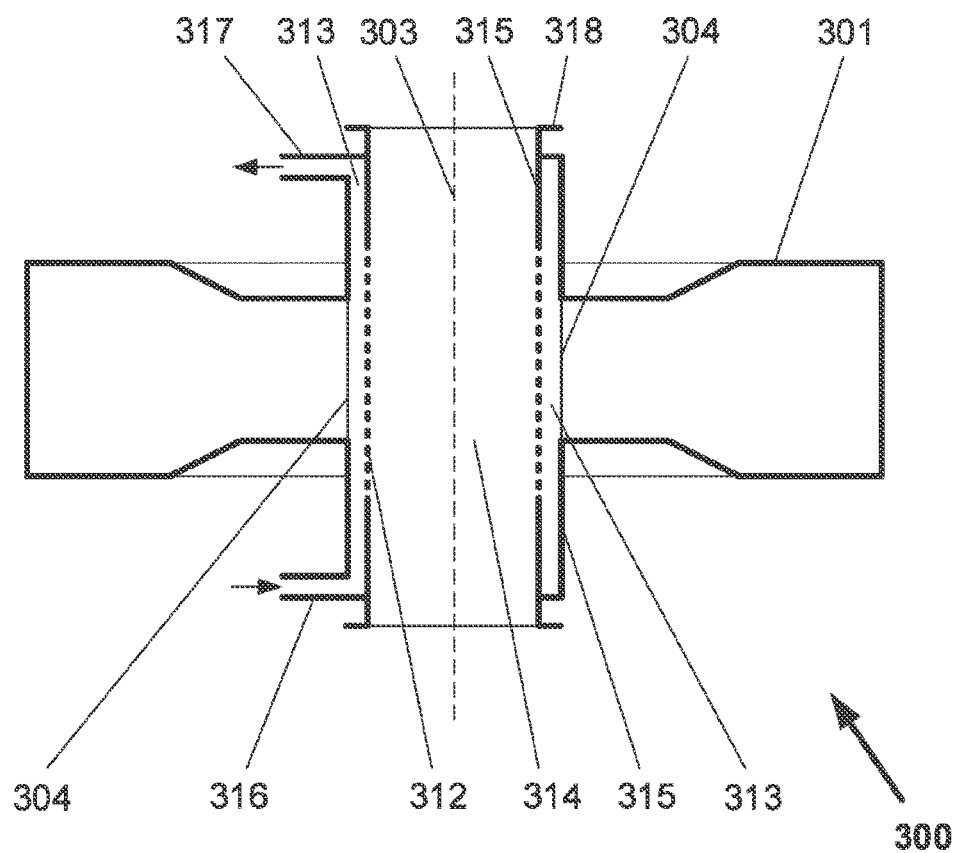
FIG. 3 is a schematic sectional view of an alternative apparatus according to the invention.

An alternative embodiment of an apparatus 300 according to the invention is shown schematically as a section in FIG. 3. apparatus 300 can comprise, for example, all of the components described for apparatus 100 from FIGS. 1 and 2. Likewise, apparatus 300 comprises: an annular housing 301; an annular electron exit window 304 formed as a first hollow cylinder; a second hollow cylinder 312 made of a stainless steel gauze, which encloses a free space 314 and through which a gaseous medium to be treated with accelerated electrons flows from bottom to top. Furthermore, the electron exit window 304 and the second hollow cylinder 312 delimit an annular space 313 through which a cooling gas also flows from bottom to top. All annular or cylindrical elements of the apparatus 300 are rotationally symmetrical about an axis 303.

Wall elements 315 lengthen the annular space 313 in the direction of the axis 303 until the annular space opens into a supply air duct 316 at the lower end and into an exhaust air duct 317 at the upper end. For example, the second hollow cylinder can be connected to pipelines by means of flange elements 318, by means of which the gaseous medium to be treated with the apparatus 300 is conducted to the apparatus 300 or, after passing through the apparatus 300, is conducted away from the apparatus 300 again.

Figure 4:
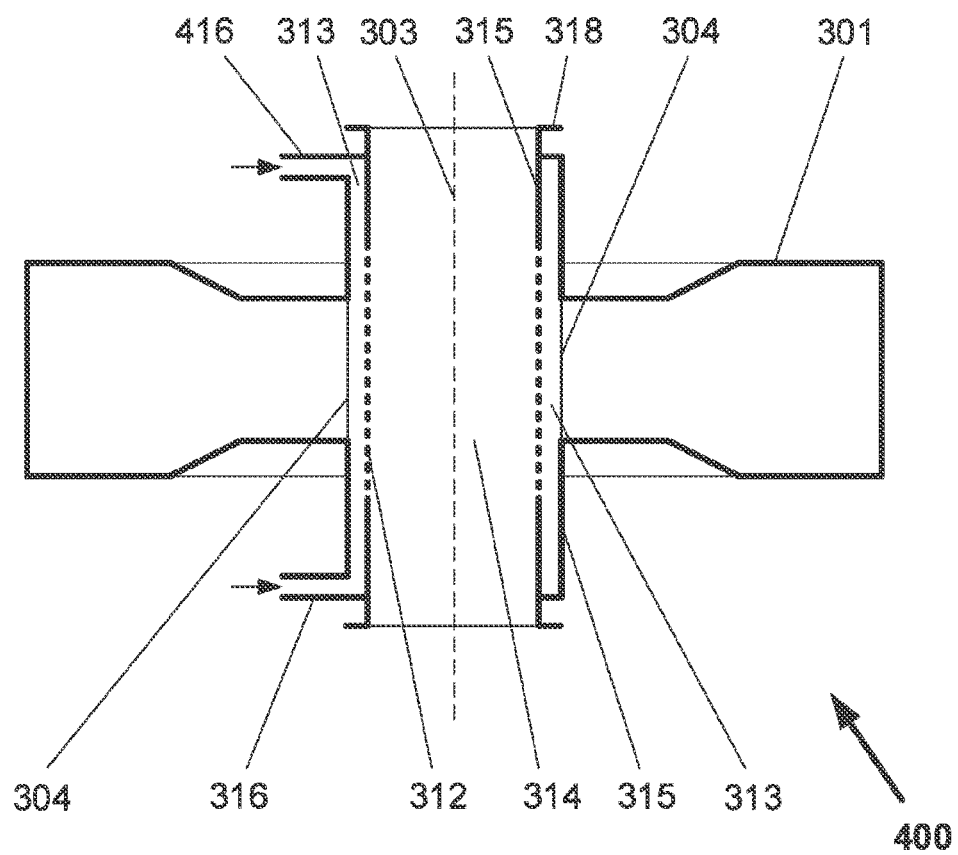
FIG. 4 is a schematic sectional view of a further alternative apparatus according to the invention.

A further alternative apparatus 400 according to the invention is shown schematically in section in FIG. 4, in which a cooling gas no longer flows through the annular space 313 in one direction only, but in which the cooling gas flows under pressure both at the lower end of the annular space 313 through the supply air duct 316 as well as at the upper end of the annular space 313 through a supply air duct 416 into the annular space 313. The cooling gas is pressed through the openings of the second hollow cylinder 312 into the interior of the second hollow cylinder 312 and is discharged there with the flow of the gaseous medium to be treated.

The apparatus 400 according to the invention described here can preferably also be used for chemical syntheses of gaseous media. It is expedient here to use a gas as the cooling gas that has at least one chemical element which, as a reactant, incurs the chemical conversion of the gaseous medium, and/or to produce the second hollow cylinder 312 consisting of at least one catalytically active element that promotes the desired chemical reaction material (such as nickel, yttrium-stabilized zirconium oxide, or lanthanide compounds) or to coat said cylinder at least on the inner wall therewith.

Figure 5:
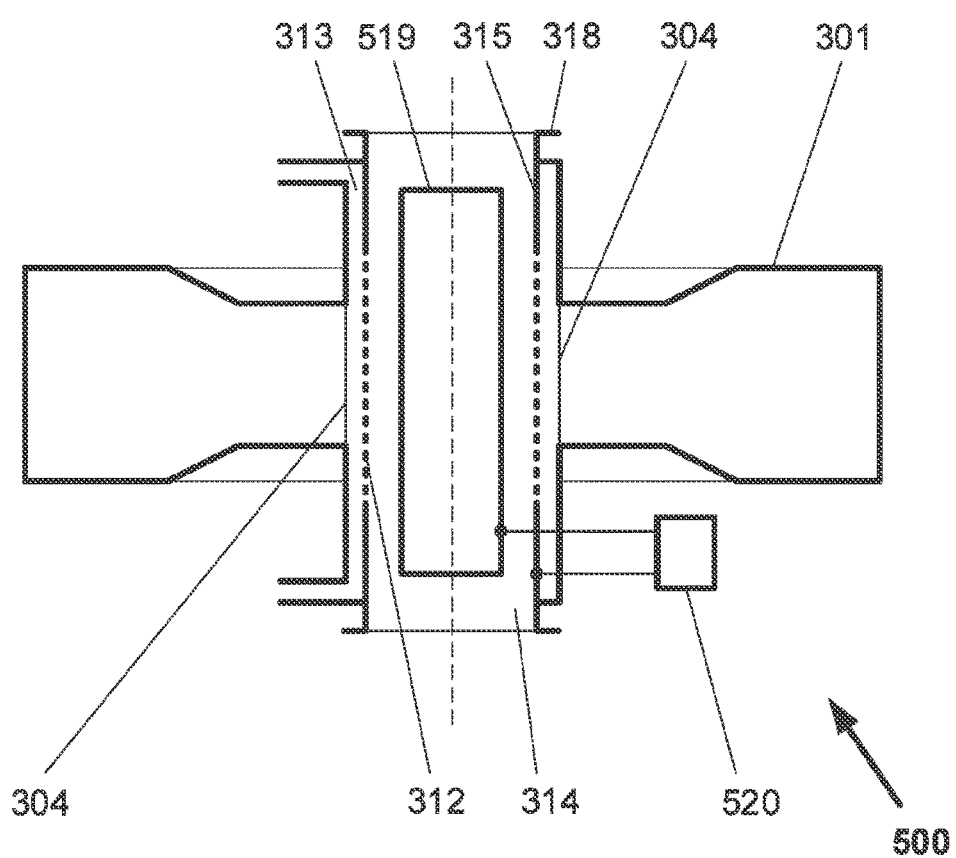
FIG. 5 is a schematic sectional view of an apparatus according to the invention with an electron reflector.

FIG. 5 shows a schematic sectional view of an apparatus 500 according to the invention, which can have the features of the apparatuses according to the invention described in FIGS. 1 to 4. In addition, the apparatus 500 has an electron reflector 519 which is arranged inside the second hollow cylinder 312. The electron reflector 519 can be of a rod-shaped form, for example, a hollow cylinder or, alternatively, made of a solid material. The electron reflector 519 can consist of a homogeneous material or also of a combination of materials, for example a metal as the base body and another metal or a compound that completely or partially covers its surface. On the outer wall of the electron reflector 519, high-energy electrons are partially elastically scattered back into the free space 314, which increases the energy dose applied to the gaseous medium to be treated, but above all makes its radial distribution more uniform.

By selecting a suitable material, in particular for the surface of the electron reflector 519, the percentage of electrons scattered back into the free space 314 (related to the beam current) can be increased. For example, refractory metals have a significantly higher electron backscatter than light metals. In one embodiment, the surface material of the electron reflector 519 comprises a refractory metal or a light metal.

Furthermore, by selecting a suitable material, in particular for the surface of the electron reflector 519, the yield of secondary electrons can be increased. When the high-energy beam electrons strike, secondary electrons are knocked out of the edge layer of the electron reflector 519 near the surface and released into the free space 314. They are low in energy (typically <50 eV) and therefore have a high interaction cross-section with atoms or molecules, and are therefore particularly able to stimulate chemical conversions.

Furthermore, it may be expedient to produce the electron reflector 519 from a temperature-resistant and/or catalytically active material that promotes the desired chemical reaction (such as nickel, yttrium-stabilized zirconium oxide, or lanthanide compounds) or to coat it therewith so that at least the surface of the electron reflector has these materials.

Depending on the intended application, it can be expedient to cool the electron reflector 519 completely or partially. In particular, it can be expedient to set or even regulate the heat dissipation from its surface in such a way that it has a desired temperature. Because of the energy input from the beam electrons, this will generally be above the temperature of the gaseous medium supplied. This increased temperature increases the effectiveness of any implemented catalysts and their cleanliness is promoted by avoiding the condensation or combustion of contaminants.

The general advantage of this arrangement, however, is that the energy transfer from the accelerated electrons to the gaseous medium now no longer takes place across the full diameter of the circle formed by the second hollow cylinder 312, but only along the path between the second hollow cylinder 312 and the electron reflector 519. Assuming moderate flow velocities (speed of sound) in the annular space 314 and thus negligible differences in density of the gaseous medium flowing around the electron reflector, this results in a significant reduction in the required electron scope and thus the acceleration voltage to be used. This lowers both the costs for the beam source and its supply units and the effort required to shield the parasitic X-rays.

The apparatus 500 can optionally include a power supply apparatus 520 by means of which an electrical voltage is provided and switched between the second hollow cylinder 312 and the electron reflector 519. The electrical voltage provided by the power supply apparatus 520 can be a direct voltage or an alternating voltage. In particular, in one embodiment, the power supply apparatus 520 can generate voltage pulses whose energy content can be increased by passive electrical stores (coils or capacitors) that can be recharged during the pulse pauses.

In a preferred embodiment, the second hollow cylinder 312 has the electrical ground potential of the apparatus 500. It is shown in FIG. 5 that one pole of the power supply apparatus 520 is electrically connected to a wall element 315. However, since the wall element 315 is electrically conductively connected to the second hollow cylinder 312, this pole of the power supply apparatus is also electrically conductively connected to the second hollow cylinder 312. By means of such an electrical voltage between the second hollow cylinder 312 and the electron reflector 519, the beam electrons that have penetrated into the free space 314, as well as the secondary electrons released there when they are decelerated in ionizing collisions, experience an additional acceleration, which can lead to further electron multiplication in the sense of a dependent gas discharge with suitable geometric and electrical dimensioning. The energy absorbed by the total amount of electrons can subsequently also be transferred to the gaseous medium and the overall effective absorbed dose can be increased in a cost-effective manner.

The reduced electric field strength (defined as the quotient of the electric field strength E and the particle density n in the discharge space) is of particular importance for the energy efficiency (defined by the ratio between the theoretical reaction enthalpy and the energy expenditure practically required for the practical realization of the desired chemical conversion) of a chemical conversion process stimulated by a gas discharge.

The interaction between high-energy electrons and the gaseous medium leads, among other things, to ionization, dissociation, electronic excitation states, and intramolecular vibrations of its atoms or molecules. The extent and presence of the respective interaction effects, technically referred to as the interaction cross-section, depends in a characteristic and material-specific way on the electron energy, and this in turn on the reduced electric field strength.

In particular (degrading or synthesizing) molecular reactions can be stimulated by excitation of intramolecular vibrational degrees of freedom. The energy supplied by the discharge apparatus in the vibration excitation primarily causes the energy barrier that inhibits the chemical conversion processes to be overcome and, in the case of endothermic reactions, effectively feeds the energy absorption into the reaction products, while the gas temperature increases only slightly and the energy efficiency of the conversion process thus improves.

By contrast, the ions, radicals, and electronically excited species formed by the application of high-energy electrons are of particular importance for the breakdown of pollutants in exhaust gases.

The efficiency of a desired chemical conversion process (not only in terms of the energy expended, but also in terms of the degree of conversion that can be achieved) can thus be improved by selectively transferring energy to the mechanism that primarily promotes the desired reaction in each case. This can be realized by choosing the reduced electric field strength of the gas discharge in such a way that it corresponds to the maximum of the interaction cross-section, while other interaction processes are not or only slightly excited at this value.

With a given particle density n and a given geometric distance d between the electrodes driving the gas discharge, a desired reduced electric field strength $E/n_{SOLL}$ can be set by suitably selecting the supply voltage $U_D$ for the discharge. For the simple model case of a plate capacitor chosen here to illustrate the dimensioning principle, this would result in $U_D = n \cdot d \; E/n_{SOLL}$ While the voltage of the additional gas discharge is expediently determined by the above optimization criterion, the energy dose transferred to the gaseous medium can be adjusted or varied by suitably selecting the discharge current, for which control circuits can be integrated to ensure a desired composition of the gaseous medium after processing.

The duration of the energy transfer to the starting materials is also decisive for many chemical transformations. The variation of the energy transfer duration thus offers a possibility of suppressing undesired recombination or secondary reactions of the reaction products formed.

For this purpose, a pulsed energy transfer is particularly expedient and allows for a very defined influence. The pulse voltage establishes a beneficial reduced electric field strength, the pulse duration determines the duration of the energy transfer and the pulse current lastly determines the transferred energy dose. To ensure a desired composition of the gaseous medium after processing, all the parameters mentioned can be integrated individually or in combination as manipulated variables in control loops.

The pulse sequence of the power supply apparatus 520 can be designed in such a way that the integrally required absorbed dose is transmitted as the sum of a number of pulses. Alternatively, the sequence can also be correlated with the flow rate of the gaseous medium in such a way that a new pulse is only generated when the previously applied gas volume has completely crossed the energy transfer zone in front of the electron exit window 304 and left again.

The cost efficiency of the power supply apparatus 520 feeding the gas discharge can be improved by implementing passive electrical stores (coils or capacitors) whose energy content is discharged into the pulses, which are then recharged with moderate power during the pulse pauses.

To further increase efficiency, it is expedient to release the electron beam that maintains and stabilizes the gas discharge, consisting of the generated accelerated electrons, only briefly and during the intended pulse duration of the pulses of the power supply apparatus 520, i.e., to pulse and to synchronize this pulsing with the pulse sequence of the gas discharge as well. In one embodiment, an electron beam formed from the accelerated electrons is therefore generated in pulse form. Optionally, the pulses of the electron beam can be synchronized with the voltage pulses of the electrical voltage generated by the power supply apparatus 520.

Figure 6:
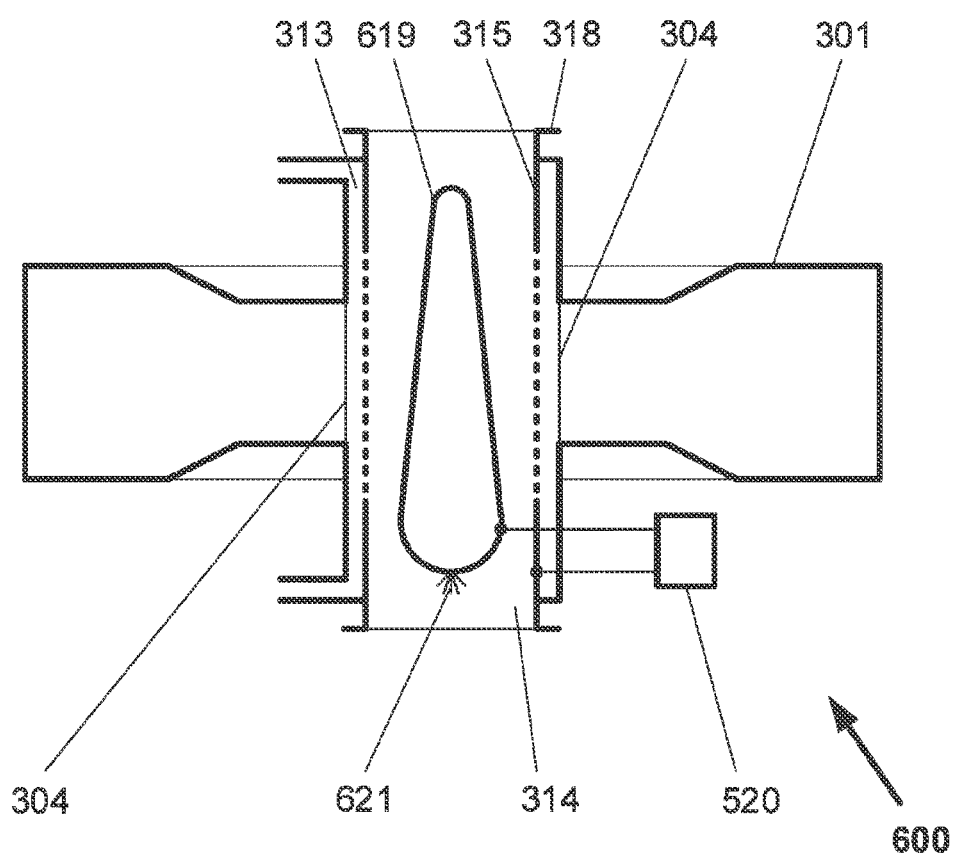
FIG. 6 is a schematic sectional view of an apparatus according to the invention with an alternative, aerodynamically shaped electron reflector and apparatuses for injecting chemical agents into the fluid flow and for realizing an additional gas discharge.

An apparatus 600 according to the invention is shown schematically in a section in FIG. 6, which has an electron reflector 619 shaped in an aerodynamically advantageous manner, in contrast to the apparatus 500 from FIG. 5. The electron reflector 619 has a drop shape and offers less flow resistance and less vortex formation to a gaseous medium that flows from bottom to top and to which accelerated electrons are to be applied compared to the rod-shaped electron reflector 519 from FIG. 5.

In one embodiment, the electron reflector 519 or 619 has at least one opening in the lower area through which (gaseous or liquid) chemical agents 621 can be sprayed axially downward into the free space 314, which then mix with the gaseous medium and are then guided together with the gas stream upward through the irradiation zone.

Alternatively, it is also possible to use at least one feed separate from the electron reflector 519 or 619 to spray chemical agents predominantly radially inward into free space 314, wherein the outlet opening of the feed is advantageously placed and aligned in such a way that the chemical agents sprayed into free space 314 are fed to the gas flow of the gaseous medium to which accelerated electrons are to be applied before the gas flow passes through the treatment space in front of the electron exit window 304. In this way, the chemical compounds to which accelerated electrons are to be applied and which are thereby activated, ionized, or split can form new chemical compounds with the chemical agents that are sprayed in.

Figure 7:
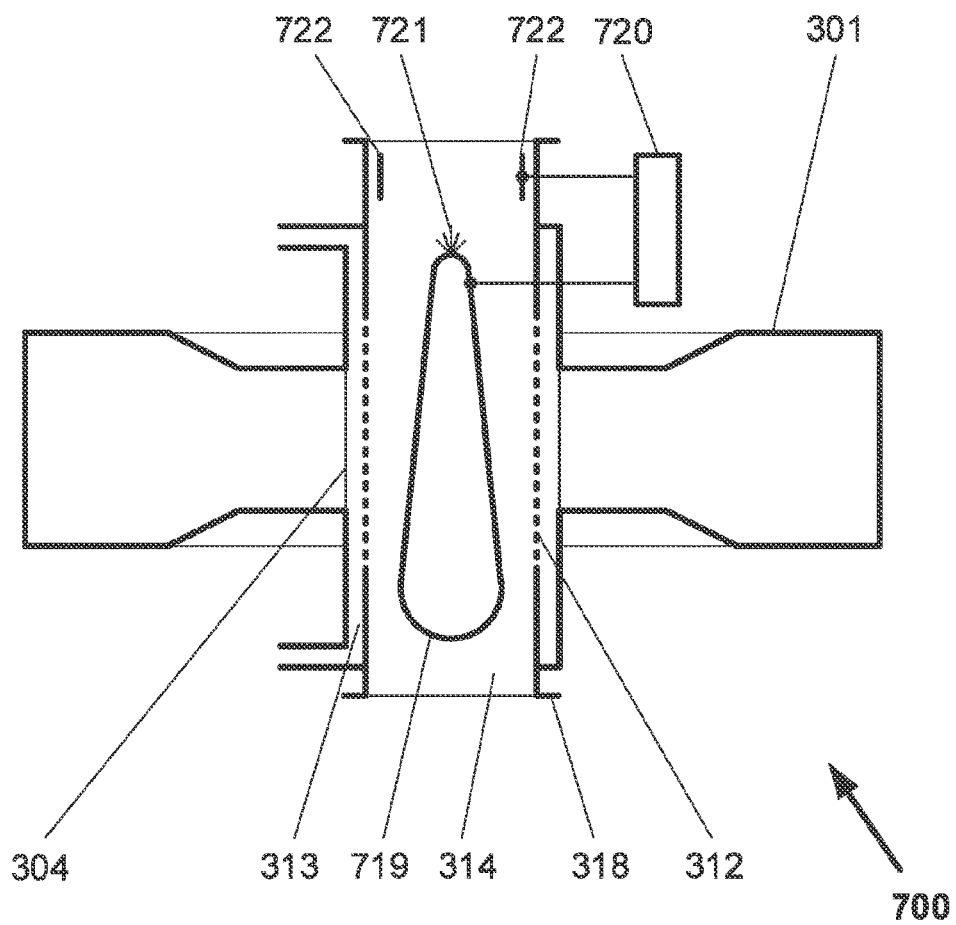
FIG. 7 is a schematic sectional view of an apparatus according to the invention with alternative apparatuses for injecting chemical agents into the gas stream of a gaseous medium to which accelerated electrons are to be applied and for realizing an additional gas discharge.

Finally, in FIG. 7, an apparatus 700 according to the invention is shown schematically in a section, which has alternative apparatus features to apparatus 600 from FIG. 6, and in which a gaseous medium to which accelerated electrons are to be applied is also guided along the main flow direction from bottom to top through free space 314. apparatus 700, like apparatus 600 from FIG. 6, comprises an aerodynamically shaped electron deflector 719, which, however, has at least one opening in the upper region through which (gaseous or liquid) chemical agents 721 can be sprayed upward into the free space 314, where they mix with the gaseous medium and are then dissipated upward together with the gas flow of the gaseous medium. This embodiment has the advantage that the risk of contamination of the electron exit window 304—for example with aerosol droplets or condensates—is ruled out.

A physical activation and subsequent chemical reaction of the sprayed agents 721 with the gaseous medium is brought about in this embodiment by a dependent gas discharge between the electron reflector 719 and an additional electrode 722 electrically insulated from ground potential and specifically from the potential of the second hollow cylinder 312. The additional electrode 722 is arranged within the gas flow of the gaseous medium to which accelerated electrons are to be applied, above the electron exit window 304, and is annular. The electrical voltage for this dependent gas discharge is provided by a power supply apparatus 720. Running the dependent gas discharge above the electron exit window 304 has the advantage that no additional thermal load associated with the gas discharge acts on the second hollow cylinder 312 or the electron exit window 304. It is advantageous to cool the additional electrode 722.

An apparatus according to the invention and a method according to the invention can be used, for example, to apply accelerated electrons to exhaust gases originating from internal combustion engines, from industrial plants, or from thermal power plants in order to split up environmentally harmful compounds that may be contained in the exhaust gases and optionally by adding to convert chemical agents into harmless compounds or compounds that can be easily retained in downstream dust filters or wet-chemical gas scrubbers.

Another possible application is in the field of molecular chemistry and plasma-chemical synthesis of gases and liquids.

Because of the cooling gas between the electron exit window and the gaseous medium to which accelerated electrons are to be applied, hot waste gases or synthesis gases can also be fed through a ring source according to the invention. It is also advantageous here that only one electron beam source and also only one of the peripherally associated apparatuses, such as a vacuum pump, high-voltage supply, and control apparatuses for the process parameters to be set, are required.

To clarify the use of and to hereby provide notice to the public, the phrases "at least one of <A>, <B>, . . . and <N>" or "at least one of <A>, <B>, . . . or <N>" or "at least one of <A>, <B>, <N>, or combinations thereof" or "<A>, <B>, and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

The invention claimed is:

1. An apparatus for applying accelerated electrons to a gaseous medium, comprising at least one electron beam generator, which has at least one cathode for emitting electrons and at least one electron exit window, wherein
   a) the at least one cathode is annular and the at least one electron exit window is formed as an annular first hollow cylinder, wherein the annular electron exit window formed as a first hollow cylinder forms an inner wall of an annular housing of the electron beam generator, wherein the electrons emitted from the cathode can be accelerated to the ring axis of the annular housing;
   b) an annular second hollow cylinder is arranged inside the electron exit window formed as the first hollow cylinder, which delimits an annular space between the first hollow cylinder and the second hollow cylinder;
   c) a cooling gas flows through the annular space between the first hollow cylinder and the second hollow cylinder and
   d) the gaseous medium to which accelerated electrons are to be applied flows through the second hollow cylinder.

2. The apparatus according to claim 1, wherein the gaseous medium to which accelerated electrons are to be applied is the exhaust gas of an internal combustion engine, an industrial plant, or a thermal power plant.

3. The apparatus according to claim 1, wherein the gaseous medium to which accelerated electrons are to be applied is a starting material for a chemical synthesis.

4. The apparatus according to claim 1, wherein the cylinder wall of the second hollow cylinder has a plurality of openings.

5. The apparatus according to claim 4, wherein the cylinder wall of the second hollow cylinder has a grid structure or is designed as a gauze.

6. The apparatus according to claim 1, wherein the cylinder wall of the second hollow cylinder consists of at least one material with a melting point >1250° C.

7. The apparatus according to claim 1, wherein the second hollow cylinder comprises, at least on its inner wall, a material which acts catalytically in a chemical reaction of the gaseous medium.

8. The apparatus according to claim 7, wherein the catalytically active material is nickel, yttrium-stabilized zirconium oxide, or a lanthanide compound.

9. The apparatus according to claim 1, wherein the cooling gas and the gaseous medium to which accelerated electrons are to be applied have the same direction of flow.

10. The apparatus according to claim 4, wherein the cooling gas flows through the plurality of openings of the second hollow cylinder from the annular space into a free space.

11. The apparatus according to claim 1, wherein a first control circuit for adjusting the pressure inside the annular space, comprising a first sensor for detecting a first actual value for a pressure inside the hollow cylinder, a second sensor for detecting a second actual value for the pressure within the annular space, an evaluation apparatus, and a fan or a pump apparatus for generating the cooling gas flow through the annular space.

12. The apparatus according to claim 1, characterized by an electron reflector which is arranged in a free space.

13. The apparatus according to claim 12, wherein a surface material of the electron reflector comprises a refractory metal or a light metal.

14. The apparatus according to claim 12, wherein a surface of the electron reflector has nickel, yttrium-stabilized zirconium oxide, or a lanthanide compound.

15. The apparatus according to claim 12, characterized by a power supply apparatus, in which one pole is electrically conductively connected to the electron reflector arranged within the free space and the other pole is electrically conductively connected to the second hollow cylinder.

16. The apparatus according to claim 12, characterized by a power supply apparatus, in which one pole is electrically conductively connected to the electron reflector arranged in the free space and the other pole is electrically conductively connected to an electrode that is arranged in the gaseous medium but electrically insulated from the second cylinder.

17. A method for applying accelerated electrons to a gaseous medium by means of an electron beam generator, which has at least one cathode for emitting electrons and at least one electron exit window, wherein
 a) the at least one cathode is annular and the at least one electron exit window is formed as an annular first hollow cylinder, wherein the annular electron exit window formed as the first hollow cylinder forms an inner wall of an annular housing of the electron beam generator, wherein the electrons emitted by the cathode are accelerated to the ring axis of the annular housing;
 b) an annular second hollow cylinder is arranged inside the electron exit window formed as the first hollow cylinder, which delimits an annular space between the first hollow cylinder and the second hollow cylinder;
 c) a cooling gas is fed through the annular space between the first hollow cylinder and the second hollow cylinder and
 d) the gaseous medium to which accelerated electrons are to be applied is fed through the second hollow cylinder.

18. The method according to claim 17, wherein an acceleration voltage of the electron beam generator is regulated as a function of a gas composition and/or a pressure and/or a temperature and/or a flow profile within the second hollow cylinder.

19. The method according to claim 17, wherein a beam current of the electron beam generator is regulated as a function of a gas composition and/or a pressure and/or a temperature and/or a flow rate within the second hollow cylinder.

20. The method according to claim 17, wherein the cooling gas used is a gas which has at least one chemical element which, as a reactant, incurs a chemical conversion of the gaseous medium.

* * * * *